(12) United States Patent
Self

(10) Patent No.: US 6,977,529 B2
(45) Date of Patent: Dec. 20, 2005

(54) DIFFERENTIAL CLOCK SIGNAL DETECTION CIRCUIT

(75) Inventor: Paul W. Self, Santa Clara, CA (US)

(73) Assignee: ICS Technologies, Inc., Wilmington, DE (US)

( * ) Notice: Subject to any disclaimer, the term of this patent is extended or adjusted under 35 U.S.C. 154(b) by 0 days.

(21) Appl. No.: 10/378,355

(22) Filed: Mar. 3, 2003

(65) Prior Publication Data

US 2003/0164720 A1    Sep. 4, 2003

Related U.S. Application Data

(60) Provisional application No. 60/361,167, filed on Mar. 1, 2002.

(51) Int. Cl.[7] ............................................. H03D 13/00
(52) U.S. Cl. ................. 327/3; 327/12; 327/60
(58) Field of Search ............................... 327/144, 198, 327/56, 58, 60, 63, 65, 72, 74, 291, 66, 3, 327/12

(56) References Cited

U.S. PATENT DOCUMENTS

| | | | |
|---|---|---|---|
| 5,057,701 A | 10/1991 | Miller, Jr. ................... | 327/292 |
| 5,196,742 A | 3/1993 | McDonald ................... | 327/65 |
| 5,268,872 A | 12/1993 | Fujii et al. ............. | 365/189.07 |
| 5,714,894 A | 2/1998 | Redman-White et al. ..... | 327/94 |
| 5,801,554 A | 9/1998 | Momma et al. ............... | 327/89 |
| 5,929,687 A | 7/1999 | Yamauchi .................... | 327/333 |
| 6,002,270 A | 12/1999 | Timoc .......................... | 326/98 |
| 6,028,455 A | 2/2000 | Yamauchi .................... | 327/52 |
| 6,037,816 A | 3/2000 | Yamauchi .................... | 327/213 |
| 6,115,430 A | 9/2000 | Tanaka et al. ............... | 375/318 |
| 6,117,813 A | 9/2000 | McCauley et al. .......... | 502/303 |
| 6,172,554 B1 * | 1/2001 | Young et al. ................ | 327/535 |
| 6,229,341 B1 | 5/2001 | Yamauchi .................... | 326/96 |
| 6,288,577 B1 * | 9/2001 | Wong ........................... | 327/65 |
| 6,417,715 B2 * | 7/2002 | Hamamoto et al. ......... | 327/291 |
| 6,535,032 B2 * | 3/2003 | Harrison ....................... | 327/66 |
| 6,650,149 B1 * | 11/2003 | Wong ........................... | 327/65 |
| 6,677,794 B2 * | 1/2004 | Kim ............................. | 327/161 |
| 6,737,892 B2 * | 5/2004 | Jong et al. .................... | 327/18 |

OTHER PUBLICATIONS

Agere Systems, Preliminary Data Sheet, Dec. 2001; LCK4801 Low Voltage HSTL Differential Clock.

* cited by examiner

*Primary Examiner*—My-Trang Nu Ton
*Assistant Examiner*—Hiep Nguyen
(74) *Attorney, Agent, or Firm*—Akin Gump Strauss Hauer & Feld, LLP

(57) ABSTRACT

A semiconductor integrated circuit includes a first clock input and a second clock input to receive elements of a differential clock signal. Each clock signal element has a logic state. The circuit generates an output activation signal that depends on the states of the differential clock input signals. Operation of the circuit does not require detection of a frequency of the differential clock signal.

27 Claims, 2 Drawing Sheets

DIFFERENTIAL CLOCK SIGNAL DETECTION CIRCUIT

RELATED APPLICATIONS AND CLAIM OF PRIORITY

This application claims priority to, and incorporates by reference in its entirety, U.S. Provisional Application No. 60/361,167, filed Mar. 1, 2002.

FIELD OF THE INVENTION

This invention relates to semiconductor integrated circuits. More particularly, the present invention relates to circuits that can detect two or more differential clock input signals and generate an output signal based on one or more logic states of the input signals wherein such logic states are outside of the normal clocking operation of the differential clock input signals. This generated output signal then can be used to initiate some action within the integrated circuit.

BACKGROUND OF THE INVENTION

Many high volume, high speed printed circuit boards distribute differential clock signals with a differential clock driver. Besides the normal function of providing clocking (or synchronization) signals to the various integrated circuits, the outputs of the differential clock driver can be used to generate a signal to activate or change a function within a device that uses the differential clock signal as an input. For example, a differential clock driver would typically generate two clock output signals that are 180 degrees out of phase with each other. These two clock signals could be used to provide synchronization for a phase-locked loop (PLL), a microprocessor or another signal processing device or circuit.

Under normal clocking (or synchronizing) operation, the two clock signals would always be in opposite states and would never simultaneously be in the same logic state. If the clock driver were to force the two clock signals to a logic state that was outside the normal clocking operation, this condition could be detected and then as the result of this detection some action could be initiated within the device that uses the two clock signals as inputs. For one pair of clock signals, there are three possible logic states that would be outside the normal clocking operation. These three states are both clock signals low, both clock signals high, or both clock signals tri-stated. For multiple pairs of clock signals, there would be other possible logic states that are outside the normal clocking operation which could be detected. One example of an action that could be initiated by this detection would be to power down a portion of an integrated circuit such as a PLL.

A problem with current clock signal detection schemes is that they use a frequency detection circuit. Under current clock signal detection circuits, if the frequency of a clock signal drops below a predetermined threshold, the circuit will generate a deactivation signal. These frequency detect circuits are somewhat more complicated than simply determining the logic state of the clock input signals. Because of this complexity, the frequency detect circuits require more electronic devices to implement, require more silicon area, and draw more power supply current. Another disadvantage with the clock frequency detect circuit is that once the differential clock signal has dropped below a certain threshold frequency, there is a significant amount of lag time until the output of the frequency detect circuit indicates that the frequency is too low. The lag time for a circuit that determines the logic state of the clock inputs is much shorter.

Accordingly, it is desirable to provide an improved clock signal detection circuit.

SUMMARY OF THE INVENTION

In accordance with a preferred embodiment of the invention a semiconductor integrated circuit includes a first input and a second input, each of which receives an element of a differential clock signal. The first element of the differential clock signal exhibits a first logic state and the second element of the differential clock signal exhibits a second logic state. The circuit generates an output that exhibits a predetermined output state when the states of the input clock signals satisfy a predetermined logic state. The output is electrically connected to an activation input of a device that also receives the differential clock signal.

In accordance with an alternate embodiment, a semiconductor integrated circuit includes a first input and a second input, each of which receives an element of a differential clock signal. The first element of the differential clock signal exhibits a first logic state and the second element of the differential clock signal exhibits a second logic state. The circuit also includes a comparing circuit that has a voltage threshold. The the comparing circuit determines whether the first logic state and/or the second logic state corresponds to one or both of the elements of the differential clock signal being below the voltage threshold. When both the first logic state and the second logic state are below the voltage threshold, the circuit generates an output that exhibits a predetermined output state.

In accordance with an additional embodiment, a semiconductor integrated circuit includes a first input and a second input, each of which receives an element of a differential clock signal. The first element of the differential clock signal exhibits a first logic state and the second element of the differential clock signal exhibits a second logic state. The circuit also includes an output that issues a control signal that is responsive to detection of the first logic state and the second logic state together being outside of normal operation of the differential clock signal. Optionally, the circuit may include multiple pairs of inputs that receive multiple differential clock signal pairs, and the output control signal may depend on whether one or more, or some specific combination, of the differential input signals are outside of normal operating logic states.

In accordance with an additional embodiment, a method of generating an activation signal includes the steps of receiving a first element of a differential clock signal, receiving a second element of the differential clock signal, comparing a logic state of the first element to a reference voltage, generating a first signal corresponding to the logic state of the first element, comparing a logic state of the second element to a reference voltage generating a second signal corresponding to the logic state of the second element, and generating an output signal that relates to the logic states of the first and second elements. The method may also include the step of using the output signal to initiate an action by a device that also receives the differential clock signal.

In accordance with an additional embodiment, a method of generating an activation signal includes the steps of receiving a first element of a differential clock signal, receiving a second element of the differential clock signal, determining whether the first element exhibits a logic state that is below a threshold and generating a first signal corresponding to the logic state of the first element, determining whether the second element exhibits a logic state that is below a threshold and generating a second signal corresponding to the logic state of the second element, and generating an output signal that relates to the first and second signals. The method may also include the step of using the output signal to initiate an action by a device that also receives the differential clock signal.

In accordance with an additional embodiment, a method of generating an activation signal includes the steps of receiving a first element of a differential clock signal, receiving a second element of a differential clock signal, and generating an activation signal that is dependent upon whether the first element and the second element are together within normal operation of the clock signal.

DETAILED DESCRIPTION OF PREFERRED EMBODIMENTS OF THE INVENTION

Embodiments of the present invention will now be described with reference to the accompanying drawings.

Figure 1:
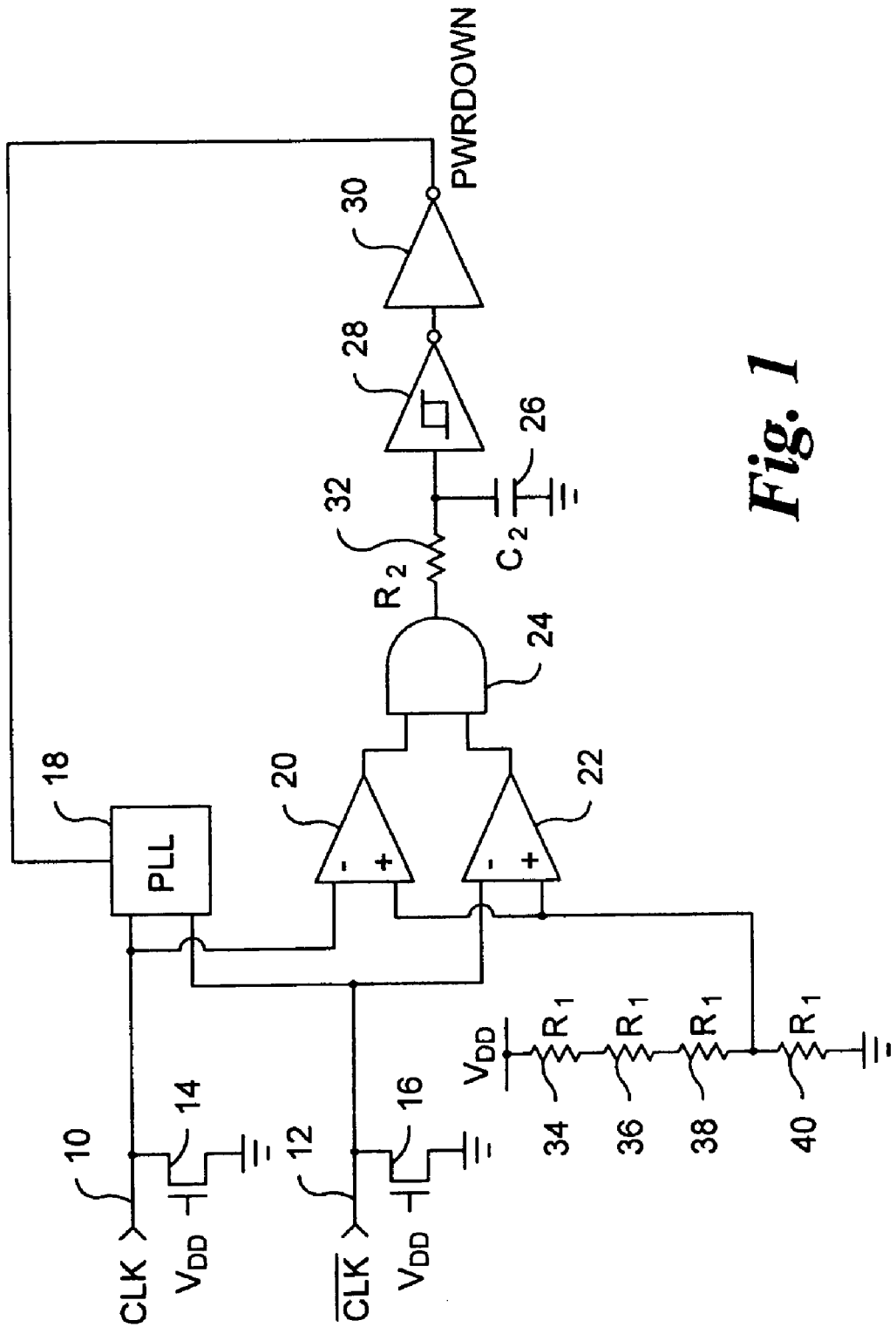
FIG. 1 is a circuit diagram showing a first preferred embodiment of the invention.

FIG. 1 shows a first embodiment where two inputs 10 and 12, forming an input pair or first input pair, receive differential clock signals, CLK and CLK' (i.e., the inverse of CLK) respectively. Each of the signals received by each of the inputs 10 and 12 is referenced to ground through an n-channel field effect transistor 14 and 16. N-channel devices 14 and 16 are not required, but they are preferred in order to provide a leakage path to ground in the event that the input signals are tri-stated. One skilled in the art will recognize that other pull-down devices, such as resistors or a series of transistors, could be used to accomplish the same function as the illustrated devices. Preferably, devices 14 and 16 provide a relatively weak path, such as a path having a resistive value of 10 KΩ or greater, although the ultimate value selected may vary depending on the expected strength of the clock signals.

In the embodiment shown, the differential clock input signals are used as inputs for PLL 18. PLL 18 is not a required element of the invention, and in fact any device that uses a differential clock input, such as a microprocessor or device or other circuit, such as a processing circuit or filtering circuit, may be used. The differential clock signals are typically provided to provide clocking or synchronization signals for the device.

In this embodiment, the signal from clock input 10 is delivered to the negative input terminal of a first voltage comparator 20. The positive input terminal of first voltage comparator 20 is referenced to a voltage that has a threshold value of ½ of reference voltage ($V_{DD}$) or less. In the embodiment shown, resistor $R_1$ 40 is directed to ground and three additional resistors such as 34, 36 and 38, each having the same value as $R_1$, are connected in series and directed to $V_{DD}$ such that the combined value of the additional resistors 34, 36 and 38 is three times that of $R_1$. Thus, the voltage threshold directed to the positive input terminal in the embodiment shown is ¼ $V_{DD}$. Other voltage thresholds are possible so long as the voltage threshold is preferably no more than ½ of reference voltage $V_{DD}$.

Similarly, the signal from clock input 12 is delivered to the negative input terminal of a second voltage comparator 22. The positive input terminal of second voltage comparator 22 is referenced to a voltage threshold in the same manner as described above for first voltage comparator 20.

Thus, in the illustrated embodiment, the voltage comparators 20 and 22 will compare the input clock signals to the reference voltage, which is illustrated as ¼ $V_{DD}$. If either of the input clock signals is at a low state, then the output of the corresponding voltage comparator will be high. If both of the input clock signals are at a low state, then the outputs of both comparators 20 and 22 will be high.

The output terminals of first voltage comparator 20 and second voltage comparator 22 are connected to the input terminals of AND gate 24, thus generating a high signal if the output of each voltage comparator 20 and 22 output is high. Thus, a high output corresponds to both clock signals being at a low state, i.e., that the clock has stopped. In embodiments that use pull-down devices 14 and 16, if both of the input signals are tri-stated, the input signals will appear to the voltage comparators to be at a low state. Thus, a high output from AND gate 24 will also correspond to both clock signals being at a tri-state in the illustrated embodiment. Other embodiments, such as embodiments using pull-up devices instead of pull-down devices, and logic structures that detect input signals at a high-high state instead of a low-low state, will be apparent to those skilled in the art based on this disclosure, and the invention is intended to include such alternate embodiments.

Preferably, although not required, the output of AND gate 24 passes through a filter such as the RC filter shown as the combination of resistor $R_2$ 32 and capacitor $C_2$ 26. Although the values of resistor $R_2$ 32 and capacitor $C_2$ 26 may vary, the combination of $R_2$ 32 and capacitor $C_2$ 26 are preferably such the time constant t of the filter, which is the product of $R_2$ 32 and capacitor $C_2$ 26, is in the nanosecond range. The optional RC filter can serve to filter out "glitches" or noise in the input signal, such as very short time periods (such as nanoseconds) in which both clock inputs 10 and 12 may momentarily exhibit a low state. Thus, the filter allows the system to differentiate noise from true low states by filtering the glitches from the signal. One skilled in the art will recognize that other filters maybe used to substitute for the illustrated embodiment, and that the filters may be placed at various locations in the system, such as before the AND gate 24.

Although not required, in the illustrated embodiment an optional Schmitt trigger 28 is used to further filter and reject noise in the signal.

After passing through the AND gate 24 and the optional RC filter and Schmitt trigger, the output signal is passed through an inverter 30, resulting in the output signal of the circuit. Thus, if both clock signals are low, the output of AND gate 24 will be high, the output of Schmitt trigger 28 will be low, and the inverter 30 will create an output signal having a high state. Since the normal operation of the differential clock signal will be such that one signal will be high and the other signal will be low, this circuit can be used to detect when the clock signals are outside of normal operation (e.g., in a low-low state) and generate the output signal in response to the detection of such a situation. The output signal may be used as a command for another device. For example, in the illustrated embodiment a high output state after inverter 30 may signal the PLL 18 to power down.

Figure 2:
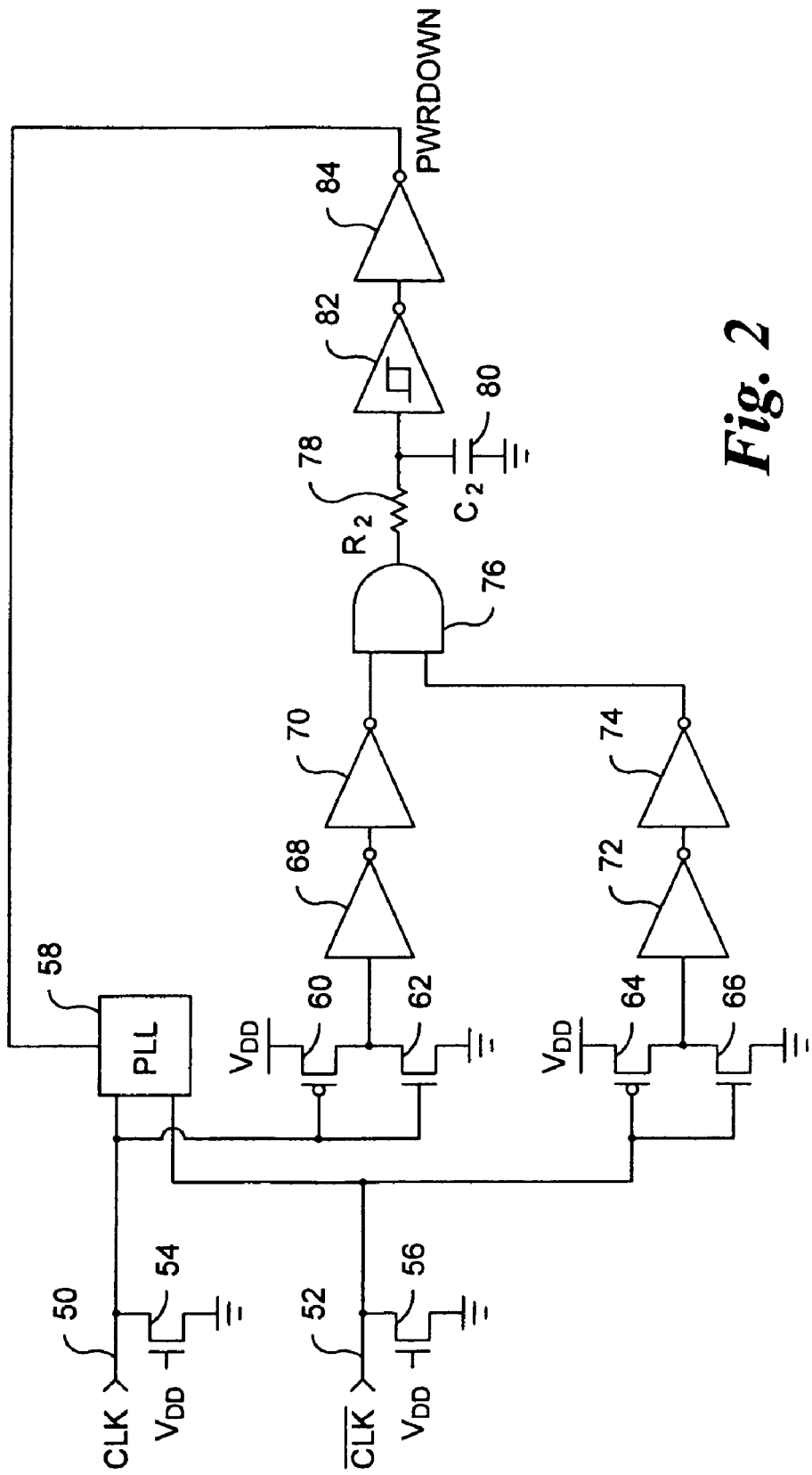
FIG. 2 is a circuit diagram showing an alternate embodiment of the invention.

FIG. 2 shows an alternate embodiment of the invention. As with the first embodiment, two inputs 50 and 52, forming an input pair or first input pair, receive differential clock signals, CLK and CLK' (i.e., the inverse of CLK) respectively. The signals received by each of the inputs 50 and 52 are referenced to ground through an n-channel field-effect transistor 54 and 56 and used as inputs for PLL 58. N-channel devices 54 and 56 are not required, but they are preferred in order to provide a leakage path to ground in the event that the input signals are tri-stated. One skilled in the art will recognize that other pull-down devices, such as resistors or a series of transistors, could be used to accomplish the same function as the illustrated devices. Preferably, devices 54 and 56 provide a relatively weak path, such as a path having a resistive value of 10 KΩ or greater, although the ultimate value may depend on the expected strength of the clock signals. As with the embodiment of FIG. 1, PLL 58 is not a required element of the invention, and in fact any device that uses a differential clock input, such as a microprocessor or device or other circuit, such as a processing circuit or filtering circuit, may be used.

The signal from clock input 50 is delivered to an input of a first CMOS inverter comprised of transistors 60 and 62. The signal from clock input 52 is delivered to an input of a second CMOS inverter comprised of transistors 64 and 66. For each inverter, if the p-channel device and n-channel device are of substantially equal strength, the switching threshold of the CMOS inverter would be about ½ of the reference voltage $V_{DD}$. However, in this invention each CMOS inverter includes a relatively weak p-channel device 60 or 64 and a relatively strong n-channel device 62 or 66. The relative strengths of the p-channel n-channel devices results in a low input switching threshold voltage. For example, the threshold voltage could be approximately 0.70 volts in an exemplary situation where $V_{DD}$ is approximately 2.5 volts. The more that the p-channel device is skewed away from the strength of the n-channel device, the lower that the input switching threshold voltage will be provided. The output of each CMOS inverter will not exhibit a high state unless the input signal is less than the input switching threshold voltage. Thus, if sufficient skew is provided, the circuit can detect low states and distinguish them from high states and intermediate states in the clock signal.

In the illustrated embodiment, the output of the first CMOS inverter is delivered to two inverters 68 and 70 in series, while the output of the second CMOS inverter is delivered to two additional inverters 72 and 74 in series. The series of inverters in each case is optional, but it is preferred in order to smooth out any edges that may be present in the output signals from the CMOS inverters.

The resulting output signals are connected to the input terminals of AND gate 76, thus generating a high signal if the output of each CMOS inverter output is high. Thus, a high output corresponds to both clock signals being at a low state, i.e., that the clock has stopped. One skilled in the art will recognize that equivalent logic structures are possible. For example, instead of a series of two inverters leading to an input terminal of AND gate 76, one may substitute single inverters leading to each input of an OR gate with an additional inverter at the output of the OR gate and not depart from the spirit or scope of the invention. In addition, in embodiments that use pull-down devices 54 and 56, if both of the input signals are tri-stated, the input signals will appear to the inverters to be at a low state. Thus, a high output from AND gate 76 will also correspond to both clock signals being at a tri-state in the illustrated embodiment. Other embodiments, such as embodiments using pull-up devices instead of pull-down devices, and logic structures that detect input signals at a high-high state instead of a low-low state, will be apparent to those skilled in the art based on this disclosure, and the invention is intended to include such alternate embodiments.

As with the first embodiment, although not required the output of AND gate 76 may pass through a filter such as the RC filter shown as the combination of resistor $R_2$ 78 and capacitor $C_2$ 80. Although the values of resistor $R_2$ 78 and capacitor $C_2$ 80 may vary, the combination of $R_2$ 78 and capacitor $C_2$ 80 are preferably such the time constant t of the filter, which is the product of $R_2$ 78 and capacitor $C_2$ 80, is in the nanosecond range. The optional RC filter can serve to filter out "glitches" or noise in the input signal, such as very short time periods (such as nanoseconds) in which both clock inputs 50 and 52 may exhibit a low state. Thus, the filter allows the system to differentiate noise from true low states by filtering the glitches from the signal. One skilled in the art will recognize that other filters, such as n-channel MOSFETs or other filter capacitors, may be used to substitute for the illustrated embodiment. In addition, the filters may be placed at various locations in the system, such as before the AND gate 76.

Although not required, in the illustrated embodiment an optional Schmitt trigger 82 is used to further filter and reject noise in the signal.

After passing through the AND gate 76 and the optional RC filter and Schmitt trigger, the output signal is passed through an inverter 84, resulting in the output signal of the circuit. Thus, if both clock signals are low, the output of AND gate 76 will be high, the output of Schmitt trigger 82 will be low, and the inverter 84 will create an output signal having a high state. Since the normal operation of the differential clock signal will be such that one signal will be high and the other signal will be low, as with the first embodiment this embodiment also can be used to detect when the clock signals are outside of normal operation (e.g., in a low-low state) and generate the output signal in response to the detection of such a situation. The output signal may be used as a command for another device. For example, in the illustrated embodiment a high output state after inverter 84 may signal the PLL 58 to power down.

Accordingly, in each of the embodiments illustrated above, the frequency of the clock signal is not essential to the operation of the clock signal detection circuit, and a frequency detection circuit or device is not required. In addition, in each of the embodiments, the differential clock signal is used to both provide clocking or synchronization for a circuit or device (e.g., a PLL), as well as to initiate some command to the circuit or device.

Alternate embodiments of the invention may accept multiple pairs of differential clock signals 10, 12 and/or 50, 52 (i.e., a first pair 10, 12 and an additional pair 10, 12 or a first pair 50, 52 and an additional pair 50, 52 formed by multiple sets of FIG. 1 and/or multiple sets of FIG. 2, respectively or in combination), and may generate an overall output PWR-DOWN depending on the logic states of one or more of the pairs of clock signals CLK, CLK' accepted by the circuit.

The invention is not limited in its application to the details of construction and to the arrangements of the components disclosed herein or illustrated in the drawings. The invention is capable of other embodiments and of being practiced and carried out in various ways. Also, it is to be understood that the phraseology and terminology employed herein is used for the purpose of description and should not be regarded as limiting.

As such, those skilled in the art will appreciate that the conception upon which this disclosure is based may readily be utilized as a basis for the designing of other structures, methods and systems for carrying out the several purposes of the present invention. Further, since numerous modifications and variations will readily occur to those skilled in the art, it is not desired to limit the invention to the exact construction and operation illustrated and described, and accordingly, all suitable modifications and equivalents may be resorted to, falling within the scope of the invention.

What is claimed is:

1. A semiconductor integrated circuit comprising:
   a first input that receives a first element of a differential clock signal, the first element having a first logic state;
   a second input that receives a second element of the differential clock signal, the second element having a second logic state;
   a processing device that also receives the differential clock signal, the processing device having an activation input that sets the processing device into a disabled state when activated, the disabled state includes powering down at least a portion of the processing device; and
   a comparing circuit having a voltage threshold and an output electrically coupled to the activation input, the comparing circuit generating an output signal when the first logic state and the second logic state are both simultaneously less than the voltage threshold and the output signal disabling the processing device.

2. The circuit of claim 1 wherein the comparing circuit comprises first and second voltage comparators that receive the first and second elements, respectively, the first voltage comparator being configured to generate an output when the first logic state is less than the voltage threshold and the second voltage comparator being configured to generate an output when the second logic state is less than the voltage threshold.

3. The circuit of claim 2 wherein each voltage comparator receives a predetermined supply voltage and the voltage threshold is less than one-half of the predetermined supply voltage.

4. The circuit of claim 1 wherein the comparing circuit includes first and second voltage comparators, each voltage comparator having an input and an output,
   the first input is electrically connected to the input of the first voltage comparator and the second input is electrically connected to the input of the second voltage comparator.

5. The circuit of claim 4 wherein each voltage comparator receives a predetermined supply voltage and determines whether its corresponding input signal exhibits a logic state that is less than a voltage threshold, the voltage threshold being no more than one half of the predetermined supply voltage of the comparator.

6. The circuit of claim 5 wherein the output of the first voltage comparator and the output of the second voltage comparator are electrically connected to inputs of an AND gate.

7. The circuit of claim 1 wherein the comparing circuit includes first and second complementary metal-oxide semiconductor (CMOS) inverters, each CMOS inverter having an input and an output,
   wherein the first input is electrically connected to the first CMOS inverter and the second input is electrically connected to the second CMOS inverter.

8. A semiconductor integrated circuit comprising:
   a first input that receives a first element of a differential clock signal, the first element having a first logic state;
   a second input that receives a second element of the differential clock signal, the second element having a second logic state;
   a processing device that also receives the differential clock signal, the processing device having an activation input that sets the processing device into a disabled state when activated;
   a comparing circuit having a voltage threshold and an output electrically coupled to the activation input, the comparing circuit generating the output signal when the first logic state and the second logic state are both simultaneously less than the voltage threshold and the output signal disabling the processing device; and
   at least one of a filter, a buffer and a Schmitt trigger coupled between the comparing circuit and the activation input.

9. The circuit of claim 8 wherein the comparing circuit comprises first and second complementary metal-oxide semiconductor (CMOS) inverters that receive the first and second elements, respectively, the first CMOS inverter being configured to generate an output when the first logic state is less than the voltage threshold and the second CMOS inverter being configured to generate an output when the second logic state is less than the voltage threshold.

10. The circuit of claim 9 wherein each CMOS inverter receives a predetermined supply voltage and the voltage threshold is less than one-half of the predetermined supply voltage.

11. A semiconductor integrated circuit comprising:
    a first complementary metal-oxide semiconductor (CMOS) inverter that receives a first differential clock signal, the first CMOS inverter generating a first CMOS output when the first differential clock signal is below a predetermined voltage threshold;
    a second CMOS inverter that receives a second differential clock signal, the second CMOS inverter generating a second CMOS output when the second differential clock signal is below the predetermined voltage threshold;
    a processing device that receives the differential clock signal, the processing device having an activation input that sets the processing device into a disabled state when activated, the processing device being one of a phase locked loop and a microprocessor; and
    a logic gate that receives the first and second CMOS inverter outputs and generates an activation signal when both of the first and second CMOS outputs are simultaneously generated, the activation signal being electrically coupled to the activation input to disable the processing device.

12. A method of disabling a processing device comprising:
    receiving a first element of a differential clock signal;
    receiving a second element of the differential clock signal;
    comparing a logic state to the first element to a voltage threshold and generating a first signal corresponding to the logic state of the first element;
    comparing a logic state of the second element to the voltage threshold and generating a second signal corresponding to the logic state of the second element; and
    generating an output signal when the logic states of the first and second elements are both simultaneously less than the voltage threshold, the output signal being electrically coupled to an activation input of the processing device to thereby disable the processing device including powering down at least a portion of the processing device.

13. The method of claim 12 wherein the processing device is one of a phase locked loop and a microprocessor.

14. A method of disabling a processing device comprising:
    receiving a first element of a differential clock signal;
    receiving a second element of the differential clock signal;
    comparing a logic state to the first element to a voltage threshold and generating a first signal corresponding to the logic state of the first element;
    comparing a logic state of the second element to the voltage threshold and generating a second signal corresponding to the logic state of the second element;

generating an output signal when the logic states of the first and second elements are both simultaneously less than the voltage threshold, the output signal being electrically coupled to an activation input of the processing device to thereby disable the processing device; and filtering the output signal using at least one of an RC filter and a Schmitt trigger.

15. A semiconductor integrated circuit comprising:
a first input that receives a first element of a differential clock signal, the first element having a first logic state;
a second input that receives a second element of the differential clock signal, the second element having a second logic state;
a processing device that also receives the differential clock signal, the processing device having an activation input that sets the processing device into a disabled state when activated, the disabled state includes powering down at least a portion of the processing device; and
a comparing circuit having a voltage threshold and an output electrically coupled to the activation input, the comparing circuit generating an output signal when the first logic state and the second logic state are both simultaneously greater than the voltage threshold and the output signal disabling the processing device.

16. The circuit of claim 15 wherein the comparing circuit comprises first and second voltage comparators that receive the first and second elements, respectively, the first voltage comparator being configured to generate an output when the first logic state is less than the voltage threshold and the second voltage comparator being configured to generate an output when the second logic state is less than the voltage threshold.

17. The circuit of claim 16 wherein each voltage comparator receives a predetermined supply voltage and the voltage threshold is less than one-half of the predetermined supply voltage.

18. The circuit of claim 15 wherein the comparing circuit includes first and second voltage comparators, each voltage comparator having an input and an output,
the first input is electrically connected to the input of the first voltage comparator and the second input is electrically connected to the input of the second voltage comparator.

19. The circuit of claim 18 wherein each voltage comparator receives a predetermined supply voltage and determines whether its corresponding input signal exhibits a logic state that is less than a voltage threshold, the voltage threshold being no more than one half of the predetermined supply voltage of the comparator.

20. The circuit of claim 19 wherein the output of the first voltage comparator and the output of the second voltage comparator are electrically connected to inputs of an AND gate.

21. The circuit of claim 15 wherein the comparing circuit includes first and second complementary metal-oxide semiconductor (CMOS) inverters, each CMOS inverter having an input and an output,
wherein the first input is electrically connected to the first CMOS inverter and the second input is electrically connected to the second CMOS inverter.

22. A semiconductor integrated circuit comprising:
a first input that receives a first element of a differential clock signal, the first element having a first logic state; and
a second input that receives a second element of the differential clock signal, the second element having a second logic state;
a processing device that also receives the differential clock signal, the processing device having an activation input that sets the processing device into a disabled state when activated, the disabled state includes powering down at least a portion of the processing device;
a comparing circuit having a voltage threshold and an output electrically coupled to the activation input, the comparing circuit generating an output signal when the first logic state and the second logic state are both simultaneously greater than the voltage threshold and the output signal disabling the processing device; and
at least one of a filter, a buffer and a Schmitt trigger coupled between the comparing circuit and the activation input.

23. The circuit of claim 22 wherein the comparing circuit comprises first and second complementary metal-oxide semiconductor (CMOS) inverters that receive the first and second elements, respectively, the first CMOS inverter being configured to generate an output when the first logic state is less than the voltage threshold and the second CMOS inverter being configured to generate an output when the second logic state is less than the voltage threshold.

24. The circuit of claim 23 wherein each CMOS inverter receives a predetermined supply voltage and the voltage threshold is less than one-half of the predetermined supply voltage.

25. A method of disabling a processing device comprising:
receiving a first element of a differential clock signal;
receiving a second element of the differential clock signal;
comparing a logic state to the first element to a voltage threshold and generating a first signal corresponding to the logic state of the first element;
comparing a logic state of the second element to the voltage threshold and generating a second signal corresponding to the logic state of the second element; and
generating an output signal when the logic states of the first and second elements are both simultaneously greater than the voltage threshold, the output signal being electrically coupled to an activation input of the processing device to thereby disable the processing device including powering down at least a portion of the processing device.

26. The method of claim 25 wherein the processing device is one of a phase locked loop and a microprocessor.

27. A method of disabling a processing device comprising:
receiving a first element of a differential clock signal;
receiving a second element of the differential clock signal;
comparing a logic state to the first element to a voltage threshold and generating a first signal corresponding to the logic state of the first element;
comparing a logic state of the second element to the voltage threshold and generating a second signal corresponding to the logic state of the second element;
generating an output signal when the logic states of the first and second elements are both simultaneously greater than the voltage threshold, the output signal being electrically coupled to an activation input of the processing device to thereby disable the processing device; and
filtering the output signal using at least one of an RC filter and a Schmitt trigger.

* * * * *